United States Patent [19]
Stephan et al.

[11] Patent Number: 5,784,254
[45] Date of Patent: Jul. 21, 1998

[54] SLIDE MOUNT SPRING CLAMP ARRANGEMENT FOR ATTACHING AN ELECTRICAL COMPONENT TO A CONVECTOR

[75] Inventors: Frank Martin Stephan, Galveston; Thurman Russell Reed, Indianapolis, both of Ind.

[73] Assignee: Delco Electronics Corporation, Kokomo, Ind.

[21] Appl. No.: 783,841

[22] Filed: Jan. 13, 1997

[51] Int. Cl.$^6$ .................... H05K 7/20; H05K 9/00
[52] U.S. Cl. .................... 361/690; 165/80.3; 165/185; 174/16.3; 174/35 R; 357/707; 357/712; 357/713; 357/727; 361/707; 361/818
[58] Field of Search .................... 165/80.2, 80.3, 165/185; 174/16.3, 35 R; 257/706–707, 712–713, 718–719, 726–727, 816, 818; 361/688, 690, 704, 707, 709, 710, 714–715, 717, 718, 722

[56] References Cited

U.S. PATENT DOCUMENTS

| | | | |
|---|---|---|---|
| 5,327,324 | 7/1994 | Roth | 361/707 |
| 5,343,362 | 8/1994 | Solberg | 361/710 |
| 5,640,304 | 6/1997 | Hellingan et al. | 361/707 |

FOREIGN PATENT DOCUMENTS 5288873  11/1993  Japan ........................ 361/709

*Primary Examiner*—Gregory D. Thompson
*Attorney, Agent, or Firm*—Jimmy L. Funke

[57] ABSTRACT

An apparatus and method for attaching an electrical component to a convector attached to a chassis of an electrical package is disclosed. The convector comprises one or more slide tracks adapted to receive a spring clamp that provides the sole means for securing a heat-generating component to the convector. The spring clamp includes a flange adapted to be grasped for insertion into the slide tracks, and adapted to cover an opening in the chassis. The spring clamp also includes a pair of prongs, each adapted to fit within one of the slide tracks, and spaced apart from one another so as to capture a rectangular protrusion on the convector therebetween when inserted into the slide tracks. Each prong preferably includes a locking hook that engages the rectangular protrusion. The locking hooks cause the prongs to be spread apart as the spring clamp is inserted into the slide tracks, and once the locking hooks reach the transverse slot, the locking hooks snap into position engaging the rectangular protrusion, providing audible, tactile and visual confirmation that the spring clamp is securely fastened to the convector.

6 Claims, 3 Drawing Sheets

SLIDE MOUNT SPRING CLAMP ARRANGEMENT FOR ATTACHING AN ELECTRICAL COMPONENT TO A CONVECTOR

BACKGROUND OF THE INVENTION

1. Field of the Invention

The present invention relates generally to apparatus for dissipating heat from electrical components and more specifically relates to an apparatus and method for securing an electrical component to a convector in an electrical assembly such as an automobile stereo, audio amplifier, home stereo system, twoway radio, computer, signal conditioner/amplifier, compact disc playing mechanism, or cassette tape playing mechanism.

2. Description of Related Art

Devices such as automobile stereos, audio amplifiers, home stereo systems, two-way radios, computers, signal conditioners/amplifiers, compact disc playing mechanisms, and cassette tape playing mechanisms are examples of products that typically require electrical components to amplify signals and regulate power. Accordingly, such devices typically contain numerous electrical components such as single in-line package (SIP) amplifiers and regulators, that are typically soldered into printed circuit boards. Such electrical components generate heat in use. The heat must be dissipated away from the electrical components to avoid damage that can be caused by excessive temperatures in the electrical components. For example, excessive temperatures can cause delicate electrical leads to fail or insulating materials to melt, thereby causing a short circuit resulting in damage to, or even failure of, the entire electrical device.

A convector is often mounted to an outer surface of such a device to dissipate heat generated by components by transferring the heat away from the components and the device to the convector and then to the air through radiation. In order to accomplish this, it is preferable that the convector be physically, in contact with the component. The components and the convector can be pressed together to allow even better heat conduction from the components to the convector. Sometimes an intermediary material such as a thermal pad or silicon grease is used between the component and the convector to assist in creating an adequate heat transfer junction.

Many convectors are made from aluminum due to the high heat conductivity of that material. Convectors often include a plurality of fins to increase the effective surface area of the convector and thereby increase the rate at which the convector can dissipate heat. Typically, aluminum convectors are formed by an extruding process, during which the fins can also be formed integrally therewith.

Convectors are usually assembled to the component or components during final assembly of the overall device in which they are used. At final assembly, components such as SIP amplifiers are already soldered into a printed circuit board. The order of assembly can vary as to which component is assembled into the chassis first. The printed circuit board can be installed into the chassis before the convector is mounted to the printed circuit board and the chassis. Alternatively, the convector can be mounted to the chassis before the printed circuit board is mounted to the convector. Sometimes, the convector is assembled to the printed circuit board to form a subassembly before being assembled to the chassis.

Typically, components are attached to the convector using a clip and one or more threaded fasteners that goes through a hole in the clip and into a hole in the convector. The clip, component and convector must all be simultaneously held in a fixture and then be fastened together with a threaded fastener. If the component includes a hole to accept a threaded fastener, it can be mounted directly to the convector using a threaded fastener that extends through that hole, without using a clip.

The use of such fasteners can have numerous drawbacks, particularly in a high volume production setting. Often, each hole in the convector that receives a fastener must be separately drilled. This is especially true for an extruded convector if the axis of the hole is not aligned with the direction in which the convector is extruded. The fastening process can vary, but there is usually some degree of automation required, ranging from manually loading a screw into a bit on a pneumatically or electrically powered driver to using self-feeding screw machines. Typically, the torque applied by the device used to drive the fasteners must be monitored daily and adjusted in order to assure proper seating of the fasteners.

The clamping force between the convector and the component should be at a proper level to ensure sufficient heat transfer to the convector. When fasteners are used to attach the convector to the component, clamping force is a function of the type of fastener and its condition and degree of assembly (e.g. the level of torque applied during installation of the fastener). Thus, a threaded fastener that is not seated all the way will give less clamping force than one that is seated all the way. Or, a stripped or improper type of fastener may provide an insufficient clamping force.

Special fixturing is often required to hold a component in the proper location while it is mounted to the convector using one or more fasteners. Such fixturing can be very complex and the use of such fixturing usually requires extra handling of both the component and of the resulting assembly, thereby adding to the production cycle time and potentially compromising quality of the final product.

When threaded fasteners are used, the assembly cycle time can be very long, especially in high volume production. The operator must typically obtain the threaded fastener, bring it in contact with the driver bit, then drive the threaded fastener. If self-tapping fasteners are used, the process of driving the self-tapping fasteners into metal often causes metal shavings to disperse into the assembly. Such shavings have been known to cause electrical failures that can permanently damage the product. If self-tapping fasteners are not used, an extra production step is necessary to form threads in the metal of the convector.

Using threaded fasteners presents a risks of any one or more of the following upstream failures occurring: stripping of threads; insufficient torque resulting in an unseated fastener; foreign object damage due to fasteners and/or metal shavings dropping into the assembly and/or a subassembly; and stripping the head of the threaded fastener. Also, a fastener installation tool, such as a driver and bit, can slip off the fastener and impact an electrical component resulting in a damaged assembly.

Fasteners further require an additional inventory burden on the production line in that the production line must be continuously stocked with part numbers (fasteners) other than the integral components that add value to the assembly. Also, special tools specifically required for assembly using fasteners, such as drivers and bits, must be continuously monitored and maintained for proper performance, wear and torque specifications. Typically, the top and/or bottom surface of the chassis must be secured in place after the component is attached to the chassis.

3

Accordingly, there is need for electrical assemblies that do not require fasteners, fixtures or tooling for securing a component to a convector.

SUMMARY OF THE INVENTION

An apparatus and method for attaching an electrical component to a convector is disclosed. The invention is particularly applicable to automobile stereos, compact disk playing mechanisms, cassette tape playing mechanisms, audio amplifiers, home stereo systems, two-way radios, computers, signal conditioners/amplifiers. However, it can be used in any device in which a component is attached to a heat-dissipating member. Instead of using threaded fasteners or threaded fasteners in combination with a clip to secure a device such as a SIP amplifier to a convector, a simple spring clamp is used. The spring clamp is installed by sliding prongs on the spring clamp into corresponding slide tracks on the convector and capturing the STP amplifier between a tang on the spring clamp and a surface on the convector. The spring clamp securely holds the SIP amplifier against the convector to ensure structural integrity of the installation and adequate heat transfer from the SIP amplifier to the convector.

In accordance with one aspect of the present invention, a convector for use in an electrical package is provided. The convector comprises a surface adapted to contact a heat-generating component and structure integral with the surface for receiving a spring clamp. The spring clamp provides the sole means for securing the heat-generating component to the convector.

In accordance with another aspect of the present invention, a convector for use in an electrical package is provided. The convector comprises a surface adapted to contact a heat-generating component and one or more slide tracks adapted Be receive a spring clamp. The spring clamp provides the sole means for securing the heat-generating component to the convector. The convector may be an extrusion and the slide tracks may be formed integrally with the convector and simultaneously with integral cooling fins on the convector.

In accordance with yet another aspect of the present invention, a mounting structure for securing a heat-generating electrical component to a convector is provided. The mounting structure comprises: a spring clamp; a convector having a surface adapted to contact the heat-generating component; and structure integral with the surface for receiving the spring clamp. The spring clamp provides the sole means for securing the heat-generating component to the convector.

In accordance with still another aspect of the present invention, a method for securing a heat-generating component to a heat-dissipating component comprises the steps of: providing a spring clamp having one or more prongs and a tang; providing be on the heat-dissipating component for receiving each prong; holding the heat-generating component in a position adjacent to the heat-dissipating component; and inserting each prong into a corresponding receiving means such that the tang presses the heat-generating component against the heat-dissipating component.

The invention itself, together with further objects and attendant advantages, will best be understood by reference to the following detailed description, taken in conjunction with the accompanying drawings.

DETAILED DESCRIPTION OF THE DRAWINGS

The invention provides an improved method and apparatus for attaching a heat-generating component to a convector.

Figure 1:
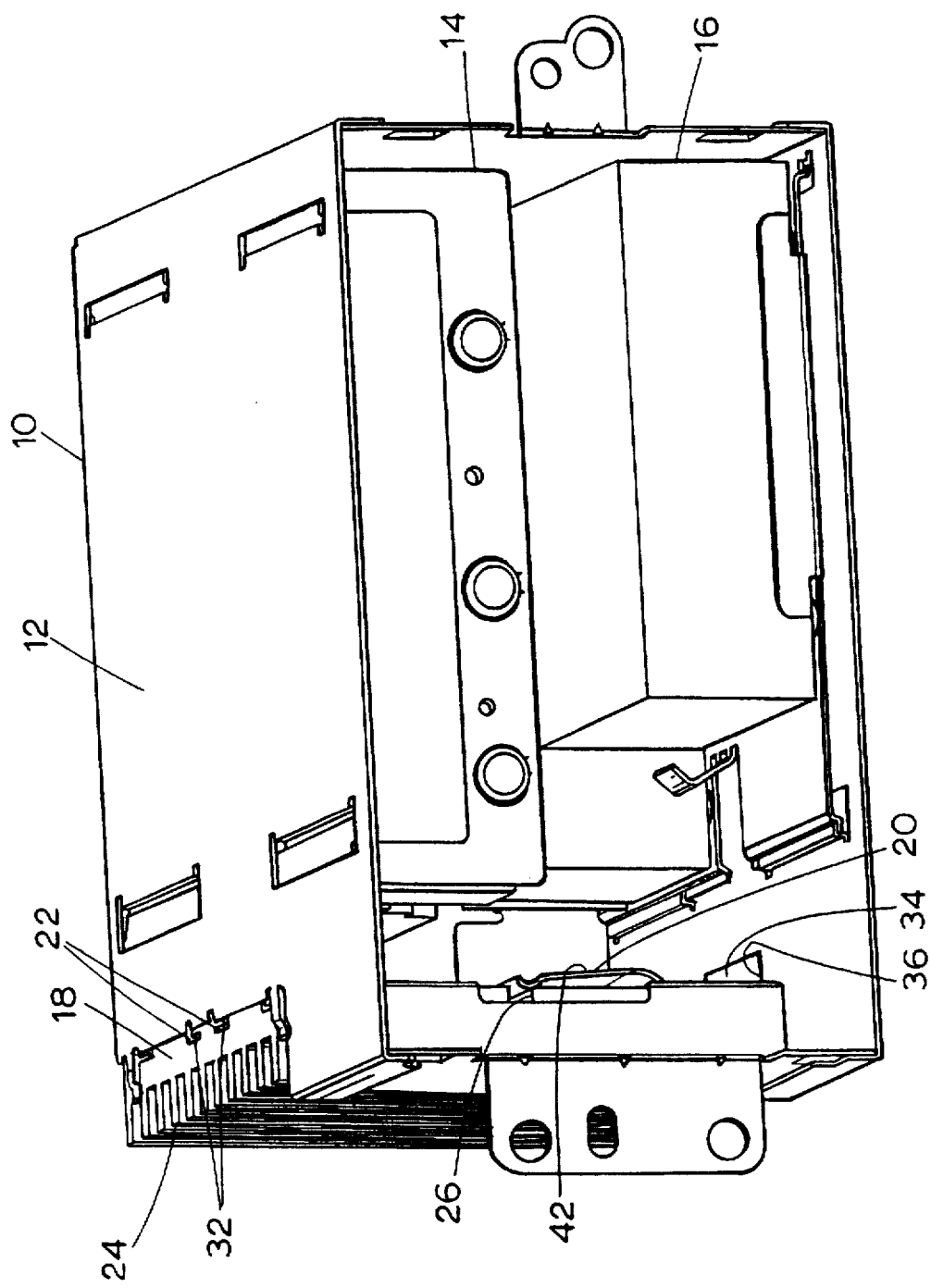
FIG. 1 is a perspective view of an electrical device including a convector in accordance with the present invention.

Now referring to FIG. 1, an electrical package, generally indicated at 10, includes a chassis 12 containing subassemblies 14 and 16. The subassemblies, 14 and 16, may be, for example, tape playing mechanisms or compact disc playing mechanisms and the electrical package 10 may be, for example, an automobile stereo unit. A convector 18 is disposed on the exterior of the electrical package 10 in order to dissipate a generated by the electrical package.

Figure 2:
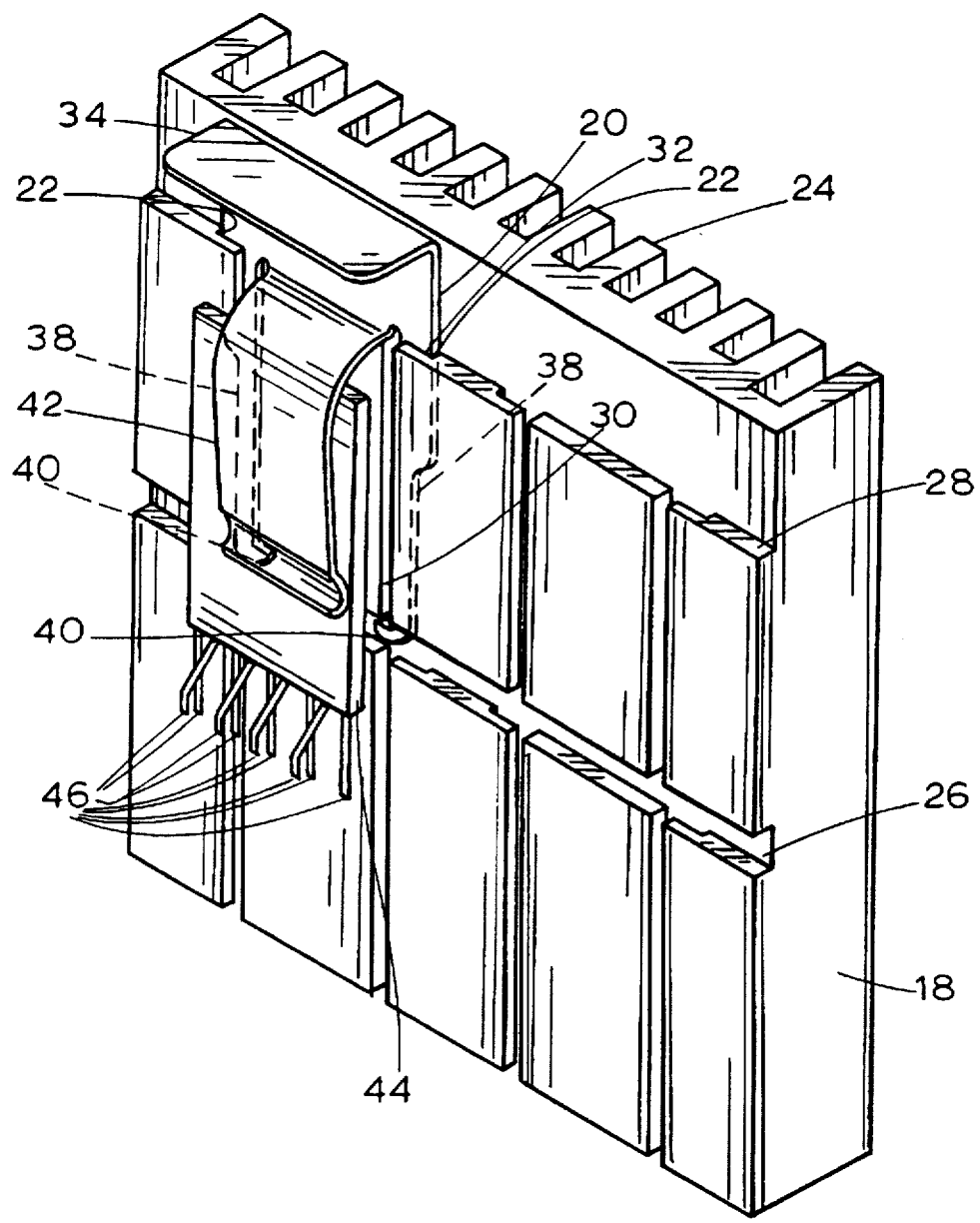
FIG. 2 is a perspective view of the convector of FIG. 1, showing an SIP device attached to the convector with a spring clamp in accordance with the present invention.

A spring clamp 20 is attached to the convector 18, as best seen in FIG. 2. To facilitate attachment of the spring clamp 20 to the convector 18, slide tracks 22 are formed in the convector 18. The slide tracks 22 may be integrally formed on the convector 18, for example, during an extrusion process by which cooling fins 24 are also integrally formed on the convector 18.

The convector also includes a transverse slot 26, aligned in a direction generally perpendicular to the slide tracks 22, and a shouldered portion 28 that is also oriented in a direction generally perpendicular to the slide tracks 22. The transverse slot 26, shouldered portion 28 and slide tracks 22 together define a rectangular protrusion 30. Each slide track 22 includes an undercut portion 32 opposite the rectangular protrusion 30.

Figure 3:
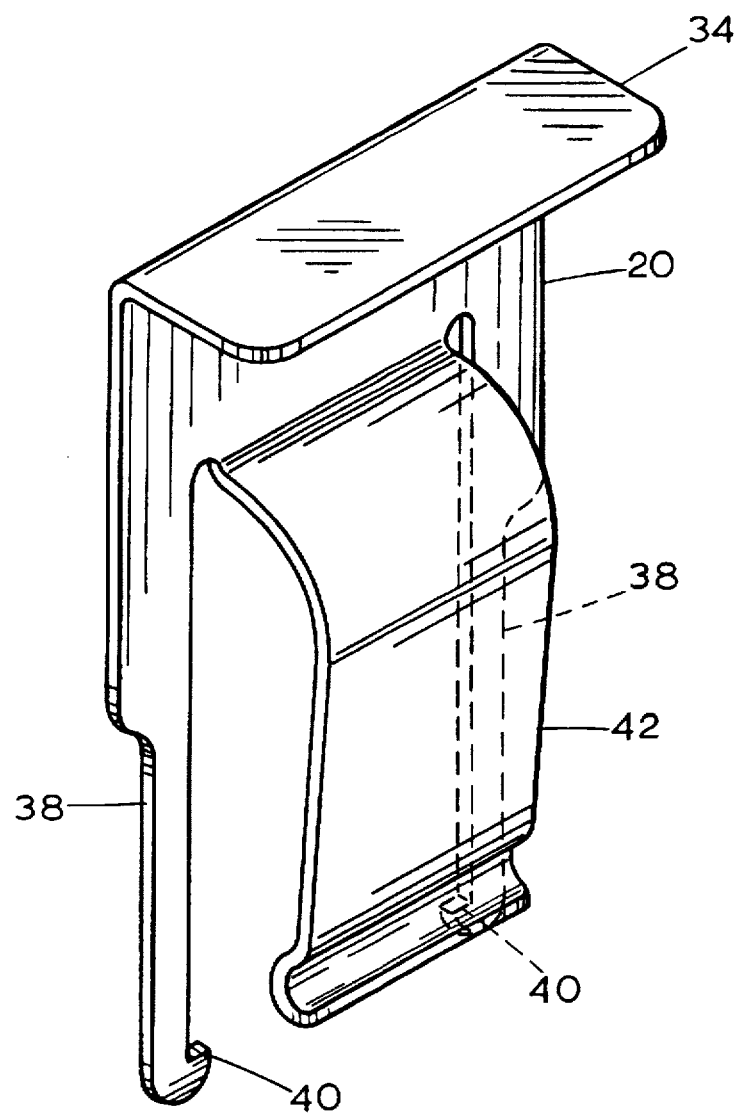
FIG. 3 is a perspective view of the spring clamp shown in FIG. 2.

The spring clamp 20 includes a flange 34 adapted to be grasped for insertion into the slide tracks 22, as described in further detail below, and adapted to cover an opening 36 (FIG. 1) in the chassis 12. The spring clamp 20, as best seen in FIG. 3, also includes a pair of prongs 38, each adapted to fit within one of the slide tracks 22, and spaced apart from one another so as to capture the rectangular protrusion 30 therebetween when inserted into the slide tracks 22, as seen in FIG. 2. Each prong 38 includes a locking hook 40 at the end thereof that engages the rectangular protrusion 30 where the corresponding slide track 22 intersects the transverse slot 26. The locking hooks 40 cause the prongs 38 to be spread apart as the prongs 38 are inserted into the slide tracks 22, and once the locking hooks 40 reach the transverse slot 26, the locking hooks 40 snap into position engaging the rectangular protrusion 30 at the intersection of the transverse slot 26. Thus, the locking hooks 40 provide audible, tactile and visual confirmation that the spring clamp 20 is securely fastened to the convector 18. The rectangular protrusion 30, along with the slide tracks 22, provide a surface adapted to be engaged by each spring clamp. The locking hooks 40 also provide an installation that is resistant to vibration, which is especially important in automotive or similar environments. The spring clamp 20 may be removed from the convector 18 by simply spreading the prongs 38 apart and sliding the spring clamp 20 out of the slide tracks 22. The spring clamp 20 includes a tang 42 that is adapted to press an electrical component, such as, for example, an SIP amplifier circuit board 44, against the convector. In FIG. 2, the SIP amplifier circuit board 44 is shown with electrical leads 46 extending therefrom in a direction generally parallel to the slide tracks 22 and pointing in a direction generally away from the flange 34. However, it will be understood that the SIP amplifier circuit board 44 may be held in place in other positions by the spring clamp 20.

The clamping force of the spring clamp 20 may be predetermined based on the geometry of the spring clamp 20. The spring clamp 20 may be made from either heat treated spring steel or high strength stainless steel, typically of 0.91 millimeter gage. As mentioned above, the flange 34 on the spring clamp 20 may be used by an operator to push the spring clamp 20 into the slide tracks 22 and also serves to cover openings in the chassis, such as opening 36 (FIG. 1), to prevent electromagnetic interference (EMI) effects that can be caused by such openings.

In order to secure an SIP amplifier circuit board 44 (or any other heat-generating component) to the convector 18, the following simple procedure may be followed. First, the SIP amplifier circuit board 44 is manually held against the rectangular protrusion 30 on the convector 18. Next, prongs 38 of the spring clamp 20 are inserted into the slide tracks 22 until the locking hooks engage the rectangular protrusion 30. Thus, the SIP amplifier circuit board 44 can be secured to the convector 18 in a single axis, single movement process, without the use of threaded fasteners.

Of course, it should be understood that a range of changes and modifications can be made to the preferred embodiment described above. For example, the locking hooks 40 and the transverse slot 26 may be omitted, as frictional forces between the prongs 38 and the rectangular protrusion 30 can be used Lo retain the spring clamp 20 in a proper position on the convector 18. It is therefore intended that the foregoing detailed description be regarded as illustrative rather than limiting and that it be understood that it is the following claims, including all equivalents, which are intended to define the scope of this invention.

The embodiments of the invention in which an exclusive property or privilege is claimed are defined as follows:

1. A package for an electrical assembly including a heat-generating component, comprising:

a closed housing defined by a sheet metal chassis and a convector for dissipating heat generated by said heat-generating component, said convector having a heat dissipative surface exterior to said housing and a component clamping surface interior to said housing, and said sheet metal chassis having an opening adjacent said convector to facilitate clamping of said heat dissipative component to said component clamping surface; and a metal spring clamp that, when inserted through the opening in said chassis, clamps the component to the component clamping surface of said convector, said clamp including an integral metal flange which covers said opening to prevent electromagnetic interference effects that would otherwise be caused by said opening.

2. The package of claim 1, wherein the component clamping surface of said convector is engaged by said spring clamp.

3. The package of claim 1, wherein said spring clamp includes prongs, and the component clamping surface of said convector includes corresponding slide tracks for receiving the prongs.

4. The package of claim 3, wherein the prongs each include means for releasably retaining the prong within the corresponding slide track.

5. The package of claim 3, wherein the prongs each include an end having a locking hook for releasably retaining the prong within the corresponding slide track.

6. The package of claim 1, wherein said spring clamp includes a tang adapted to press the component against the component clamping surface of said convector.

* * * * *